United States Patent
Yano et al.

(10) Patent No.: US 8,637,124 B2
(45) Date of Patent: Jan. 28, 2014

(54) OXIDE MATERIAL AND SPUTTERING TARGET

(75) Inventors: Koki Yano, Sodegaura (JP); Kazuyoshi Inoue, Sodegaura (JP); Nobuo Tanaka, Sodegaura (JP); Tokie Tanaka, legal representative, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 980 days.

(21) Appl. No.: 12/067,705

(22) PCT Filed: Sep. 15, 2006

(86) PCT No.: PCT/JP2006/318391
§ 371 (c)(1),
(2), (4) Date: Jul. 6, 2010

(87) PCT Pub. No.: WO2007/034749
PCT Pub. Date: Mar. 29, 2007

(65) Prior Publication Data
US 2010/0266787 A1 Oct. 21, 2010

(30) Foreign Application Priority Data
Sep. 22, 2005 (JP) .................................. 2005-276813

(51) Int. Cl.
C09K 19/42 (2006.01)
C04B 41/52 (2006.01)
C01G 19/00 (2006.01)

(52) U.S. Cl.
USPC ............ 428/1.1; 428/688; 428/689; 428/697; 423/594.9; 204/298.13

(58) Field of Classification Search
None
See application file for complete search history.

(56) References Cited

U.S. PATENT DOCUMENTS

| | | | |
|---|---|---|---|
| 5,972,527 A | 10/1999 | Kaijou et al. | |
| 6,180,828 B1 * | 1/2001 | Hidaka et al. | ............. 564/479 |
| 6,534,183 B1 | 3/2003 | Inoue | |
| 6,669,830 B1 | 12/2003 | Inoue et al. | |
| 2001/0005019 A1 * | 6/2001 | Ishikawa | ...................... 257/59 |
| 2003/0148871 A1 | 8/2003 | Inoue | |

FOREIGN PATENT DOCUMENTS

| | | | |
|---|---|---|---|
| JP | 5-70943 A | 3/1993 | |
| JP | 06-234565 A | 8/1994 | |
| JP | 6-318406 A | 11/1994 | |
| JP | 2000-256061 A | 9/2000 | |
| JP | 2000256061 A * | 9/2000 | ............ C04B 35/457 |
| JP | 2001-155549 A | 6/2001 | |
| TW | 514 622 | 12/2002 | |
| TW | 2004 02475 | 2/2004 | |
| TW | 2005 23226 | 7/2005 | |
| WO | WO 01/38565 | 5/2001 | |

OTHER PUBLICATIONS

Kovacheva et al., Preparation of crystalline ZnSnO3 from Li2SnO3 by low-temperature ion exchange, 1998, Solid State Ionics, vol. 109, pp. 327-332.*

(Continued)

*Primary Examiner* — Ellen S Raudenbush
*Assistant Examiner* — Anthony J Frost
(74) *Attorney, Agent, or Firm* — Millen, White, Zelano & Branigan, P.C.

(57) ABSTRACT

An oxide material including indium (In), tin (Sn), and metal element M, and including an ilmenite structure compound; a sputtering target composed thereof; a transparent conductive film formed by using such a sputtering target; and a transparent electrode composed of such a transparent conductive film.

13 Claims, 2 Drawing Sheets

(56) References Cited

OTHER PUBLICATIONS

Abstract of TW-200402475, Publication Date: Feb. 16, 2004.
Abstract of TW-200523226, Publication Date: Jul. 16, 2005.
Translation of part of Taiwanese Office Action relating to TW200402475 and TW200523226 dated Sep. 25, 2012.

D. Kovacheva et al., "Preparation of crystalline $ZnSnO_3$ from $Li_2SnO_3$ by low-temperature ion exchange" *Solid State Ionics*, 1998, vol. 109, Nos. 3&4.
M. Inagaki et al., "Synthesis of $MSn(OH)_6$ by Corecipitation and of . . . ," *Zeitschrift für anorganische und allgemeine chemie*, 1985, 527, pp. 193-202.
"Technology of Transparent Conductive Film".

* cited by examiner

OXIDE MATERIAL AND SPUTTERING TARGET

TECHNICAL FIELD

The invention relates to an oxide material, a sputtering target and a transparent conductive film formed by sputtering the sputtering target.

BACKGROUND

Tin-containing ilmenite structure compounds (e.g. $ZnSnO_3$) have attracted attention for use in various applications including gas sensors, moisture sensors, electrodes for solar cells, and transparent conductive materials. Tin-containing ilmenite structure compounds such as $ZnSnO_3$ are, however, difficult to be generated. In addition, it is reported that, at temperatures exceeding 700° C., a reaction represented by $2ZnSO_3 \rightarrow Zn_2SnO_4 + SnO_2$ occurs, preventing stable existence of a tin-containing ilmenite structure compound (Non-Patent Documents 1 to 4). Under such circumstances, a tin-containing ilmenite structure compound having thermal stability has been desired.

It is also reported that a tin-containing ilmenite structure compound such as $ZnSnO_3$ has a resistance lower than that of a spinel structure compound such as $Zn_2SnO_3$ (Non-Patent Document 5). However, since a tin-containing ilmenite structure compound is unstable at temperatures exceeding 700° C., no studies have been made on the use of a tin-containing ilmenite structure compound in a sintered target which is normally produced by treating at high temperatures. Also, no studies have been made on a transparent conductive film formed using such a target by sputtering, pulse laser deposition or ion-plating.

Further, in applications of gas sensors, moisture sensors, electrodes for solar cells, no studies have been made on a tin-containing ilmenite structure compound containing indium in an amount exceeding a certain level.

In recent years, development of displays has been remarkable. A liquid crystal display (LCD), an electroluminescence display (EL), a field emission display (FED), or the like is used as a display device for business machines such as personal computers and word processors, and display devices for control systems in factories. These displays have a sandwich structure in which a display device is held between transparent conductive oxides.

A main stream material for such a transparent conductive oxide is indium tin oxide (hereinafter occasionally abbreviated as "ITO") prepared by a sputtering method, an ion plating method, or a vapor deposition method as described in Non-Patent Document 1.

ITO is composed of a specific amount of indium oxide and tin oxide, possesses excellent transparency and conductivity, can be etched using a strong acid, and exhibits high adhesion to a substrate.

Although ITO (a composite oxide of indium and tin which normally contains tin in an amount of about 5 to 15 atomic percent) has excellent properties as a material for transparent conductive oxide, ITO is not only a scarce resource, but also contains a large amount (about 90 atomic percent) of indium which is a biologically harmful element. Moreover, the indium itself produces nodules (projections) during sputtering. The nodules produced on the target surface have been one of the causes of abnormal electrical discharge. In particular, when an amorphous ITO film is produced for improving etching properties, the indium compound on the surface of the target is reduced due to introduction of a small amount of water and hydrogen gas in the sputtering chamber, giving rise to further production of nodules. If an abnormal electrical discharge occurs, scattered materials become attached to the transparent conductive oxide as impurities during or immediately after the film formation.

The indium content in ITO must be reduced due to these problems of instability of supply (scarcity), hazardous properties and nodule generation during sputtering. If an attempt is made to reduce the indium content of ITO to 80 atomic percent or less, a high-resistance tin compound in a target has electric carriers (charges), leading to problems such as a higher likelihood in the occurrence of abnormal electrical discharge and difficulty in etching with an acidic aqueous solution.

As a method for preventing generation of nodules and suppressing abnormal electrical discharge, incorporation of a hexagonal layered compound of $In_2O_3(ZnO)_m$, wherein m is an integer of 2 to 20, with a crystal grain diameter of 5 μm or less has been investigated (Patent Documents 1 and 2). However, if the indium content is reduced to 70 atomic percent or less in this method, there are problems such as decrease of the sintered density and conductivity of the target, which causes abnormal electrical discharge and retards the film forming speed; low target strength, leading to easy cracking; and poor heat resistance in the presence of air of the transparent conductive film formed by sputtering.

Patent Document 1: WO01/038599
Patent Document 2: JP-A-06-234565
Non-Patent Document 1: Solid State Ionics Volume 109, Issues 3-4, 2 Jun. 1998, pp. 327-332
Non-Patent Document 2: Z. Anorg. Allg. Chem. 527 (1985), p. 193
Non-Patent Document 3: Z. Anorg. Allg. Chem. 527 (1985), pp. 193-202
Non-Patent Document 4: Kh. S. Valeev, E. I. Medvedovskaya, S. D. Notkina, T. Gosudarst, Issledovatel. Elektrokeram. Inst. 4 (1960) 80 (in Russian)
Non-Patent Document 5: "Technology of Transparent Conductive Film" edited by The 166th Committee of Transparent Oxide and Photoelectron Material, Japan Society for Promotion of Science, Ohmsha, Ltd. (1999)

An object of the invention is to provide a material having a tin-containing ilmenite structure compound, a method for producing thereof, a low-resistance, high-strength target with a high theoretical relative density using the material, a target having a small indium content, a target which allows sputtering to be performed stably while suppressing abnormal electrical discharge which occurs during formation of a transparent conductive film by sputtering, a transparent conductive film, formed using the targets, which has a low in-plane distribution of specific resistance and a transparent electrode.

SUMMARY OF THE INVENTION

As mentioned above, a tin-containing ilmenite structure compound such as $ZnSnO_3$ is difficult to be generated, and is reported not to exist stably at temperatures exceeding 700° C. due to occurrence of such a reaction as $2ZnSO_3 \rightarrow Zn_2SnO_4 + SnO_2$.

Specifically, for instance, if a mixture of zinc oxide and tin oxide is sintered at a temperature of 700° C. or higher, $Zn_2SnO_4$, $ZnO$ and $SnO_2$ are generated. Therefore, a $ZnSnO_3$ compound having an ilmenite structure could not be obtained by conventional methods.

The inventors have found that, by incorporating a certain amount of indium to an oxide sintered body containing tin and element M, an ilmenite structure compound shown by $ABO_3$ can be generated stably. The inventors have also found that this material can be applied to gas sensors, temperature sensors, solar cells, field effect transistors, or the like, and can also be applied to various electronic materials or transparent conductive materials after pulverization or other treatments.

The inventors have found that a sintered body comprising this material is suited for use as a sputtering target, since it has a low bulk resistance and a low theoretical relative density due to the presence of ilmenite structure compound, though the indium content thereof is low as compared with ITO which is commonly used.

Further, the inventors have also found that a transparent conductive film formed by sputtering this target is excellent in in-plane uniformity, heat resistance or the like, and therefore suited for use in various applications such as displays represented by liquid displays, touch panels, and dielectric protective layers for phase change optical recording media. The invention has been made based on these findings.

The invention provides the following sputtering target or the like.
1. An oxide material comprising indium (In), tin (Sn), and metal element M, and comprising an ilmenite structure compound.
2. The oxide material according to 1, wherein the metal element M is zinc (Zn).
3. The oxide material according to 1 or 2, wherein, in an X-ray diffraction (XRD), the maximum peak intensity of the ilmenite structure compound is at least 6 times as large as the maximum peak intensity of a rutile structure compound.
4. The oxide material according to any one of 1 to 3, wherein the atomic ratio of In/(In+Sn+M) is in a range of 0.25 to 0.55, the atomic ratio of Sn/(In+Sn+M) is in a range of 0.25 to 0.5, and the atomic ratio of M/(In+Sn+M) is in a range of 0.2 to 0.5.
5. The oxide material according to any one of 1 to 4, wherein, in an X-ray diffraction (XRD), the maximum peak position of the ilmenite structure compound shifts toward the minus direction (narrow-angle side) from the maximum peak position of ilmenite structure compound powder comprising tin and the metal element M.
6. The oxide material according to any one of 1 to 5, which is a sintered body having a bulk resistance of 0.2 to 10 mΩ·cm.
7. The oxide material according to any one of 1 to 6, which is a sintered body having a theoretical relative density of 90% or more.
8. The oxide material according to any one of 1 to 7, wherein the crystal grain diameter of the ilmenite structure compound is 20 μm or less.
9. A sputtering target, which comprises the oxide material according to any one of 1 to 8.
10. A method for producing an oxide material comprising an ilmenite structure compound, which comprises heating raw materials at a temperature of 700° C. or higher;
the raw materials being an indium compound, and a tin compound, and a compound of metal element M;
an atomic ratio of indium (In/(In+Sn+M)) being 0.25 to 0.55 and an atomic ratio of tin (Sn/(In+Sn+M)) being 0.25 to 0.5 in the total amount of the raw materials.
11. A transparent conductive film, which is formed by sputtering the sputtering target according to 9.
12. A transparent common electrode provided on the color filter side of a TFT-driven liquid crystal panel, which comprises the transparent conductive film according to 11.
13. A transparent electrode, which is prepared by dry etching the transparent conductive film according to 11.

The invention provides a material containing a tin-containing ilmenite structure compound, a method for producing thereof, and a target obtained therefrom having a high theoretical relative density, a low resistance and a high strength.

The invention provides an oxide material applicable to various transparent conductive materials.

The invention provides a transparent conductive film improved in conductivity, in-plane uniformity, heat resistance, or other properties.

BEST MODE FOR CARRYING OUT THE INVENTION

The invention will be described in detail below.
I. Oxide Material and Sputtering Target
(I-1) Constitution of Oxide Material and Sputtering Target The sputtering target of the invention is a sintered body of the oxide material of the invention, and the sputtering target and the sintered body of the oxide material have the same constitution. Therefore, both the sintered body of the oxide material and the sputtering target hereinafter occasionally be simply referred to as "sputtering target".

The target of the invention comprises indium, tin, metal element M, and comprises an ilmenite structure compound.

As examples of the metal element M, a positive divalent metal element having an ionic radius of 1.1 Å or less is preferable. A positive divalent metal element having an ionic radius of 1.0 Å or less is more preferable. Specific examples of such a metal element include Zn, Co, Mg, Mn and Ni. Of these, Zn is preferable.

The ilmenite structure is a kind of crystal structure. Generally, it means a crystal structure in which two-third of octahedron clearances formed of anions (usually oxygen ions in an oxide) by cubic closest packing are filled with cations, and normally shown by $ABO_3$. For details, reference can be made to "Guide to Crystallography" (Yoshinori Sasaki, Hiroshi Yamamura, Kazuyuki Kakegawa, Kentaro Yamaguchi, Kaoru Igarashi: Published by Asakura Publishing Co., Ltd.) or "Crystallography: Main Start Point of Studies on Inorganic materials" (Mitsuhiro Nakadaira: Published by Kodansha Ltd.).

The crystalline structure of the compound in the target can be determined by observing a specimen collected from the target by the X-ray diffraction analysis.

For example, the ilmenite structure compound containing tin and zinc (normally shown by $ZnSnO_3$) is as compound which, in X-ray diffraction, shows a peak pattern of No. 52-1381 of the Joint Committee on Powder Diffraction Standards (JCPDS) database or an analogous (shifted) pattern. The ilmenite structure compound also includes a compound in which In, Sn and Zn are arranged periodically on the common site, and a compound in which In, Sn and Zn are arranged at random (often called corundum).

In the target of the invention, it is preferred that the maximum peak intensity of the ilmenite structure compound be at least 6 times as large as that of the rutile structure compound.

If the maximum peak intensity of the ilmenite structure compound is less than 6 times that of the rutile structure compound, the target may have a large resistance or the in-plane distribution of physical properties including specific resistance of a transparent conductive film formed by sputtering may increase.

The maximum peak intensity of the ilmenite structure compound, which is at least 6 times as large as that of the rutile structure compound, can be confirmed by analyzing the X-ray diffraction chart. It is more preferred that the maximum peak intensity of the ilmenite structure compound be at least 10 times as large as that of the rutile structure compound.

In the target of the invention, other than the ilmenite structure compounds, as compounds exhibiting a peak, the following compounds are expected to be generated; spinel structure compounds shown by $Zn_2SnO_4$; rutile structure compounds shown by $SnO_2$; bixbyite structure compounds shown by $In_2O_3$; hexagonal layered structure compounds shown by $In_2O_3(ZnO)_m$; and wurtzite structure compounds shown by ZnO. The above-mentioned structure compounds, except for the rutile structure compounds shown by $SnO_2$, may be contained in the target of the invention within an amount range which does not impair the advantageous effects of the invention. It is more preferred that the ilmenite structure compound and the bixbyite structure compound be the main components. It is particularly preferred that the ilmenite structure compound be the main component. Presence of the ilmenite structure compound as the main component can be confirmed by observing the X-ray diffraction peak intensity.

Figure 1:
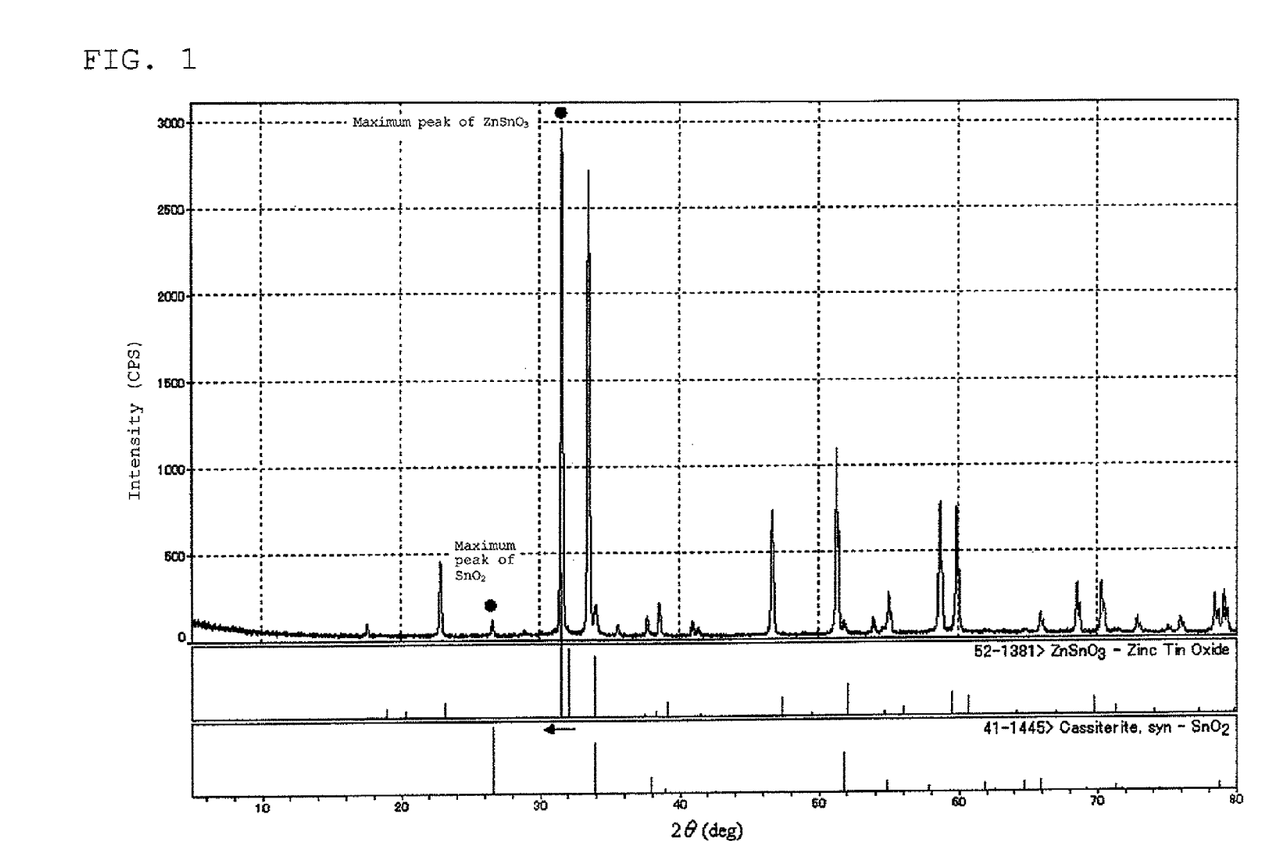
FIG. 1 is an X-ray diffraction chart of a target obtained in Example 1.

FIG. 1 is an X-ray diffraction chart of the target prepared in Example 1. From this chart, it can be confirmed that the maximum peak intensity of the ilmenite structure compound shown by $ZnSnO_3$, which was contained in the target produced in Example 1, is approximately 20 times as large as that of the rutile structure compound shown by $SnO_2$. That is, it is understood that the ilmenite compound is the main component.

In the target of the invention, it is preferred that the atomic ratio of In/(In+Sn+M) be in a range of 0.25 to 0.55, the atomic ratio of Sn/(In+Sn+M) be in a range of 0.25 to 0.5, and the atomic ratio of M/(In+Sn+M) be in a range of 0.2 to 0.5.

Here, each atomic ratio can be measured by the inductivity coupled plasma (ICP) emission spectrometry.

If the atomic ratio of In/(In+Sn+M) is less than 0.25, a compound having a different crystal structure may generate, causing production of a $ZnSnO_3$ compound having an ilmenite structure to be difficult or causing the resistance of the target to increase. If the atomic ratio of In/(In+Sn+M) exceeds 0.55, formation of a $ZnSnO_3$ compound having an ilmenite structure may be difficult or the amount of indium may increase excessively. The atomic ratio of In/(In+Sn+M) is more preferably in a range of 0.25 to 0.49, still more preferably in a range of 0.3 to 0.45.

If the atomic ratio of Sn/(In+Sn+M) is less than 0.25 or exceeds 0.5, formation of a $ZnSnO_3$ compound having an ilmenite structure may be difficult or the target may have an increased resistance. The atomic ratio of Sn/(In+Sn+M) is preferably in a range of 0.3 to 0.5, more preferably in a range of 0.3 to 0.45, and particularly preferably in a range of 0.3 to 0.4.

If the atomic ratio of M/(In+Sn+M) is less than 0.2 or exceeds 0.5, formation of an $MSnO_3$ compound having an ilmenite structure may be difficult. The atomic ratio of M/(In+Sn+M) is preferably in a range of 0.27 to 0.45, more preferably in a range of 0.3 to 0.4.

In the target of the invention, in an X-ray diffraction (XRD), it is preferred that the maximum peak position of the ilmenite structure compound shift toward the minus direction (narrow-angle side) of the maximum peak position of No. 52-1381 of the JCPDS database.

The angle of the peak shift can be measured by analyzing the X-ray diffraction chart. FIG. 1 is an X-ray diffraction chart of the target obtained in Example 1, which is given later. From this chart, it can be confirmed that the maximum peak position of the ilmenite structure compound shift by 0.5° in the minus direction (narrow-angle side). The reason therefor is considered to be an increased distance between gratings of the ilmenite structure compound, which is supposed to be $ZnSnO_3$, due to the presence of indium.

If the distance of the shift is small, generation of carriers is insufficient, resulting in an increase in the resistance of the target. The reason therefor appears to be insufficient generation of carrier electrons due to a small amount (number of atoms) of indium solid-dissolved in the ilmenite structure compound. In addition, if the distance of the shift is small, indium may have a different crystal structure, resulting in a higher bulk resistance and a decreased strength.

It is preferred that the maximum peak position of the ilmenite structure compound shift to the minus direction (narrow-angle side), preferably by 0.2° or more, particularly preferably 0.3° or more.

It is preferred that the target of the invention be comprised of an oxide sintered body which has a bulk resistance in a range of 0.2 to 10 mΩ·cm.

The bulk resistance of the target can be measured by the four-probe method.

If the bulk resistance is less than 0.2 mΩ·cm, the resistance may became lower than the resistance of the formed film and scattered film may produce nodules. If more than 10 mΩ·cm, sputtering may be unstable.

The bulk resistance of the invention is preferably in a range of 0.3 to 5 mΩ·cm, more preferably in a range of 0.4 to 3 mΩ·cm.

It is preferred that the target of the invention be an oxide sintered body having a theoretical relative density of 90% or more.

If the theoretical relative density is smaller than 90%, the target may crack during discharge.

The theoretical relative density is more preferably 90% or more, still more preferably 95% or more, and particularly preferably 98% or more.

Theoretical relative density is determined as follows.

The density of the target is calculated from the content ratio of ZnO, $SnO_2$, and $In_2O_3$ assuming that their specific gravities are respectively 5.66 g/cm$^3$, 6.95 g/cm$^3$, and 7.12 g/cm$^3$. Then, the ratio of the calculated density to the density measured by Archimedes principle is calculated. The resulting value is used as theoretical relative density.

In the target of the invention, the crystal grain diameter of the ilmenite structure compound is preferably 20 μm or less.

If the crystal grain diameter of the ilmenite structure compound is more than 20 μm, the grain boundary serves as a stress concentration point, which may result in a decrease of strength. The crystal grain diameter of the ilmenite structure compound is preferably 8 μm or less, particularly preferably 4 μm or less.

The crystal grain diameter of the ilmenite structure compound in the target can be measured by means of an electron probe microanalyzer (EPMA).

The deflecting strength of the target of the invention is preferably 10 kg/mm$^2$ or more, more preferably 11 kg/mm$^2$ or more, and particularly preferably 12 kg/mm$^2$ or more. There is a possibility that the target may be damaged due to the load applied during transportation and installation. For this reason, the target needs to have deflecting strength of a degree not less than a certain level. If the deflecting strength is less than 10 kg/mm$^2$, the target may not be usable.

The deflecting strength of the target can be measured according to JIS 81601.

The oxide material of the invention can be rendered powdery, and can be applied to various transparent conductive materials.

Examples of the method for making the oxide sintered body of the invention powdery include pulverizing by means of a ball mill or the like and firing raw material powder without molding to form fired powder. Also, the oxide sintered body of the invention can be rendered powdery by a reaction in a solution.

The oxide sintered body of the invention in the powder form (transparent conductive oxide powder) can be used, for example, as the raw materials of coating material for conductive films or dielectric films.

(I-2) Method for Producing Target

The method for producing a sputtering target (oxide material containing an ilmenite structure compound) of the invention (hereinafter often referred to as the method for producing a target of the invention) comprises heating raw materials at a temperature of 700° C. or higher;

the raw materials being a tin compound and a compound of metal element M, and an indium compound; and an atomic ratio of indium In/(In+Sn+M) being 0.25 to 0.55 and an atomic ratio of tin Sn/(In+Sn+M) being 0.25 to 0.5 in the total amount of the raw material.

It was difficult to form an ilmenite structure compound at temperatures exceeding 700° C. by conventional methods, whereas a tin-containing ilmenite structure compound having thermal stability can be formed according to the method for producing a target of the invention.

Each step of the method of producing a target (oxide material containing an ilmenite structure compound) of the invention is described below.

(1) Mixing Step

The mixing step is a step of mixing metal compounds as the raw materials of the sputtering target.

It is preferred that metal compounds used as the raw materials for producing the target be homogeneously mixed and pulverized using a common mixer such as a wet ball mill, or a bead mill or an ultrasonic device.

The compounds of indium, tin, and metal element M, which are the raw materials of the target are required to have an atomic ratio of In/(In+Sn+M) in a range of 0.25 to 0.55. It is preferred that these compounds be mixed such that the atomic ratio of Sn/(In+Sn+M) in a range of 0.25 to 0.5 and the atomic ratio of M/(In+Sn+M) be in a range of 0.2 to 0.5. If the atomic ratio of In/(In+Sn+M) is outside the above-mentioned range, the target of the invention having the above-mentioned advantageous effects cannot be obtained.

In addition, the atomic ratio of Sn/(Sn+M) is more preferably in a range of 0.3 to 0.45, particularly preferably in a range of 0.3 to 0.40. If the atomic ratio of Sn/(Sn+M) is within the above-mentioned range, a $ZnSnO_3$ compound is readily generated. Particularly, if the atomic ratio of Sn/(Sn+M) is larger than 0.5, the resistance of the target may increase due to the formation of $SnO_2$.

As examples of the indium compounds, indium oxide, iridium hydroxide, and the like can be given.

As examples of the tin compounds, tin oxide, tin hydroxide, and the like can be given.

As examples of the metal element M, zinc is preferable. Examples of the zinc compound include zinc oxide and zinc hydroxide.

Among these compounds, oxides are preferable due to ease of sintering and almost no possibility of leaving byproduct residues.

The purity of the raw materials is usually 2N (99 mass %) or more, preferably 3N (99.9 mass %) or more, and particularly preferably 4N (99.99 mass %) or more. If the purity is less than 2N, a $ZnSO_3$ compound having an ilmenite structure may be hard to be generated or the target may suffer from problems such as discoloration.

When pulverizing the metal oxides used as the raw material of the target, the particle diameter of the metal oxides after pulverization is usually 10 μm or less, preferably 3 μm or less. When the particle diameter of the metal oxides is too large, it may be difficult to increase the density of the target.

The particle diameters of the metal oxides used as the raw material of the target after pulverization can be measured according to JIS R1619.

(2) Prefiring Step

A prefiring step is optionally provided in order to preliminarily fire (heat treat) the mixture of the indium compound, the tin compound and the compound of metal element M (preferably a zinc compound) after preparation of such a mixture.

In the prefiring step, it is preferable to treat the mixture with heat at 500° to 1,200° C. for 1 to 100 hours.

Because, if the temperature is lower than 500° C. or the period of heat treatment is less than one hour, thermal decomposition of the indium compound or the compound of metal element M (preferably, a zinc compound) may be insufficient. If the temperature is higher than 1,200° C. or the period of heat treatment is more than 100 hours, the resulting particles may become large.

Therefore, a heat treatment (prefiring) at 800° to 1,200° C. for 2 to 50 hours is particularly preferable.

The prefired body obtained in this step is preferably pulverized before molding and sintering. The pulverization of the prefired body is preferably carried out by using a ball mill, a roll mill, a pearl mill, a jet mill, or the like so that the prefired body has a particle diameter in a range of 0.01 to 1.0 μm.

The particle size of the prefired body can be measured according to JIS R 1619.

(3) Molding Step

The molding step is an essential step of press-molding the mixture of metal oxides (or the prefired body when the prefiring step is provided) to form the molded product. The product is molded into a form suitable as a target. When the prefiring step is provided, the resulting prefired powder may be granulated and the granules may be formed into a desired shape by press-molding.

Although die molding, cast molding, injection molding, and the like can be given as the method for molding that can be used in this step, in order to obtain a sintered body with a high sintered density, it is preferred that the mixture be subjected to molding by cold isostatic press (CIP) method or the like before subjecting to a sintering treatment given later.

A mold assistant agent such as polyvinyl alcohol, methyl cellulose, poly wax, and oleic acid may be used in the molding process.

(4) Firing Step

The firing step is an essential step of firing (heat treatment) the molded product obtained in the molding step, specifically, by granulating the powder and molding the powder into a desired shape by press-molding, at a temperature of 700° C. or higher.

The firing can be carried out by hot isostatic press (HIP) firing and the like.

The firing is carried out in an oxygen atmosphere or under an oxygen pressure at a temperature usually of 700° to 1,700° C., preferably 1,100° to 1,600° C., and more preferably 1,300° to 1,500° C. for usually 30 minutes to 360 hours, preferably 8 to 180 hours, and more preferably 12 to 96 hours.

If the powder mixture is fired in an atmosphere not containing oxygen gas or at a temperature of 1,700° C. or more, generation of a hexagonal layered compound may be predominant, and production of an ilmenite structure compound may be insufficient. If the temperature is lower than 700° C., the objective crystal forms may not be produced, the sintered body density may not be increased, the target resistance may increase, and strength may decrease.

If the sintering temperature is low, a high-resistance $In_2O_3(ZnO)_m$, wherein m is an integer of 4 to 20, may be generated.

The heating rate during the firing is usually 5° to 600° C./hour, preferably 50° to 500° C./hour, and more preferably 100° to 400° C./hour. If the heating rate is more than 600° C./hour, a hexagonal layered compound may be produced, leading to insufficient formation of the ilmenite structure compound. The heating rate of less than 5° C./hour is too slow and may impair productivity.

The cooling rate is usually 5° to 600° C./hour, preferably 50° to 500° C./hour, and more preferably 100° to 400° C./hour. If the cooling rate is more than 600° C./hour, a hexagonal layered compound may be produced, leading to insufficient formation of the ilmenite structure compound. The cooling rate of less than 5° C./hour is too slow and may impair productivity.

(5) Reducing Step

A reducing step is optionally provided in order to uniform the bulk resistance of the sintered body obtained in the firing step throughout the entire target by a reducing treatment.

As examples of the reducing method used in this step, a method of using a reducing gas, a method of reducing by firing under vacuum, a method of reducing in an inert gas, and the like can be given.

In the case of the method of using a reducing gas, hydrogen, methane, carbon monoxide or a mixture of these gases with oxygen may be used.

In the case of reduction by firing in an inert gas, nitrogen, argon, or a mixture of these gases with oxygen may be used.

The reducing treatment is carried out usually at 100° to 800° C., and preferably 200° to 800° C., for usually 0.01 to 10 hours, and preferably 0.05 to 5 hours.

(6) Working Step

A working step is optionally provided to cut the sintered body obtained by sintering in the above-mentioned manner into a form suitable for mounting on a sputtering apparatus and to attach a mounting jig such as a backing plate.

The thickness of the target is usually 2 to 20 mm, preferably 3 to 12 mm, and particularly preferably 4 to 6 mm. It is possible to attach two or more targets to one backing plate to obtain a single target in substance. The surface is preferably finished using a No. 80 to 10,000 diamond wheel, and particularly preferably using a No. 100 to 1,000 diamond wheel. If a diamond wheel smaller than No. 80 is used, the target may be easily cracked.

Although the use of the above-mentioned production method of the target of the invention is preferable in order to produce the target of the invention, the method is not particularly limited insofar as the compounds of indium, tin and metal element M which are the raw materials of the target are mixed at the above-mentioned specific atomic ratio and fired under the above-mentioned firing temperature conditions (heat treatment conditions). The other steps can be carried out without particular limitations. For example, common methods disclosed in JP-A-2002-69544, JP-A-2004-359984, and Japanese Patent No. 3628554 can be used.

Further, as the method for producing a sputtering target actually implemented on the industrial scale, the following methods or combination of parts thereof may be used.

Method of Manufacturing Sputtering Target for Industrial Use (1)
(i) Wet-blend and pulverize weighed raw materials together with water and adjuvants in a ball-mill, bead mill, etc.
(ii) Dry the resulting raw material mixture using a spray dryer, etc., and granulate to obtain a granule powder.
(iii) Press-mold the granule powder, followed by SIP molding using a rubber die.
(iv) Fire the molded product under oxygen pressure to obtain a fired body.
(v) Cut the resulting fired body using a diamond cutter, water cutter, etc. and grind using a diamond wheel, etc.
(vi) Apply a wax agent such as metal indium, and secure the resulting target to a backing plate made of copper or the like.
(vii) Grind the backing plate to remove the wax agent, oxidized layer, etc. and treat the surface of the target.

Method of Manufacturing Sputtering Target for Industrial Use (2)
(i) Dry-blend and pulverize weighed raw materials in a ball mill or the like to obtain a granule powder.
(ii) Press-mold the resulting granular powder.
(iii) Fire the molded product under atmospheric pressure to obtain a fired body.

Method of Manufacturing Sputtering Target for Industrial Use (3)
(i) Dry-blend and pulverize weighed raw materials in a ball mill or the like to obtain a granule powder.
(ii) Wet-blend and pulverize the granule powder in a ball mill, V-blender, etc. to obtain a dispersion of granule powder.
(iii) Mold the dispersion of granule powder by cast molding to obtain a molded product.
(iv) Dry the molded product by bringing into contact with air on a supporting body, and fire under atmospheric pressure to obtain a fired product.

II. Transparent Conductive Film (II-1) Constitution of Transparent Conductive Film The transparent conductive film of the invention is prepared by using the sputtering target of the invention by the sputtering method.

The transparent conductive film of the invention is preferably amorphous or microcrystalline, and particularly preferably amorphous. If the transparent conductive film is crystalline, the etching rate during preparation of a transparent electrode (explained later) may be slow, residues may remain after etching.

It is desirable for the transparent conductive film of the invention to have resistance to PAN (a mixture of phosphoric acid, acetic acid, and nitric acid) which is a metal wiring etching solution. If the transparent conductive film is resistant to PAN, it is possible to etch the metal wiring without melting the transparent conductive film after forming a metal wiring material film on the transparent conductive film.

The transparent conductive film of the invention has a specific resistance of preferably 1,800 $\mu\Omega\cdot cm$ or less, more preferably 1,300 $\mu\Omega\cdot cm$ or less, and particularly preferably 900 $\mu\Omega\cdot cm$ or less.

The specific resistance of the transparent conductive film can be measured by the four probe method.

The transparent conductive film of the invention preferably has an in-plane distribution of specific resistance (Max/Min) of 0.1 to 10.

Here, the in-plane distribution of specific resistance (Max/Min) is defined as the value obtained by measuring 6 to 100 specific resistances by the four-probe method, and dividing the maximum specific resistance thereof by the minimum specific resistance thereof.

If the in-plane distribution of specific resistance (Max/Min) exceeds 10, the transparent conductive film may suffer partial operation failure or percentage defective may increase when used as an electrode. The in-plain distribution of specific resistance (Max/Min) is preferably in a range of 0 to 5, more preferably in a range of 0 to 2.

The thickness of the transparent conductive film of the invention is normally in a range of 1 to 500 nm, preferably in a range of 10 to 240 nm, and more preferably in a range of 20 to 190 nm.

The thickness of the transparent conductive film can be measured by the tracer method.

The transparent conductive film of the invention is provided on the color filter side of a TFT-driven liquid crystal panel and can be used as a transparent common electrode.

Here, the transparent common electrode is defined as a transparent electrode on the color filter side of a TFT-driven liquid crystal panel. Properties required for the transparent common electrode include 85% or more of transmittance and 200 μΩ·cm or less of specific resistance. The transparent electrode of the invention is provided with these properties.

The transparent conductive film of the invention excels in thermal stability in atmosphere, and hence can be used as a highly durable electrode.

(II-2) Method for Producing Transparent Conductive Film

Although there are no particular limitations to the sputtering method and the sputtering conditions for producing the transparent conductive film of the invention, the direct current (DC) magnetron method, the alternate current (AC) magnetron method, and the high frequency (RF) magnetron method are preferable. Since a large apparatus is required for application to a liquid crystal display (LCD) panel, the DC magnetron method and the AC magnetron method are preferable, with the AC magnetron method which enables stable film forming being particularly preferred.

Sputtering can be carried out under a pressure usually in a range of 0.05 to 2 Pa, preferably in a range of 0.1 to 1 Pa, and more preferably in a range of 0.2 to 0.8 Pa, under an ultimate pressure usually in a range of $10^{-3}$ to $10^{-7}$ Pa, preferably in a range of $5 \times 10^{-4}$ to $10^{-6}$ Pa, and more preferably in a range of $10^{-4}$ to $10^{-5}$ Pa, and at a substrate temperature usually in a range of 25° to 500° C., preferably in a range of 50° to 300° C., and more preferably in a range of 100° to 250° C.

An inert gas such as Ne, Ar, Kr, Xe and the like can be usually used as an introduced gas. Of these, Ar is preferable since the film-forming speed is high. In the case in which the ratio of zinc to tin is less than 1 (Zn/Sn<1), inclusion of oxygen in the introduced gas in an amount of 0.01 to 5% is preferable because of easy reduction of the bulk resistance. When the ratio of zinc to tin is more than 2 (Zn/Sn>2), inclusion of hydrogen in the introduced gas in an amount of 0.01 to 5% is preferable because of easy reduction of the resistance of the transparent conductive film.

III. Transparent Electrode (III-1) Constitution of Transparent Electrode

Because the transparent electrode of the invention is prepared by dry etching the transparent conductive film of the invention, the transparent electrode of the invention has the above properties of the transparent conductive film of the invention.

The electrode edge of the transparent electrode of the invention has a taper angle preferably in the range of 60° to 120°. The taper angle at the electrode edge can be measured by observing the cross-section using a scanning electron microscope (SEM).

If the electrode edge has a taper angle of less than 60°, the length of the electrode edge portion becomes too long. When a liquid crystal panel or an organic electroluminescence panel is driven, there may be a difference of contrast between the pixel peripheral part and the inside. If the taper angle is more than 120°, the electrode may crack or delaminate at the edge portion, which may cause defects of an oriented film and breakage.

(III-2) Method for Producing Transparent Electrode

The method for producing a transparent electrode is characterized by dry etching the transparent conductive film of the invention. By using the dry etching method, a pattern with a narrow line width can be obtained with a high-degree of accuracy.

There are no particular restrictions on the dry etching method used to prepare the transparent electrode of the invention, and suitable etching conditions can be selected according to the purpose and circumstances. The following etching conditions are preferable.

The methods disclosed in Non-Patent Document 5 or other documents may be used. Of these, reactive ion etching is preferable since the taper angle can be readily adjusted.

EXAMPLES

The invention will be described in more detail with reference to the following examples, which should not be construed as limiting the scope of the invention.

Example 1

(1) Production of Sputtering Target

As raw materials for the target, indium oxide with an average particle diameter of 3.4 μm and a purity of 4N, zinc oxide with an average particle diameter of 0.6 μm and a purity of 4N, and tin oxide with an average particle diameter of 0.5 μm and a purity of 4N were mixed at atomic ratios of In/(In+Sn+Zn)=0.36, Sn/(In+Sn+Zn)=0.33, and Zn/(In+Sn+Zn)=0.31. The mixture was supplied to a wet-type ball mill and pulverized for 72 hours to obtain a raw material fine powder.

The resulting fine powder of the raw materials was granulated, and the granules were press-molded to obtain a molded article with a diameter of 10 cm and a thickness of mm. The molded article was put into a firing kiln and fired at 1,400° C. under oxygen pressure for 48 hours to obtain a sintered body (target). The temperature was elevated at a rate of 100° C./min during firing.

(2) Evaluation of Sputtering Target

The theoretical relative density, bulk resistance, X-ray diffraction analysis, crystal grain diameter, and various properties of the resulting target were measured. The X-ray diffraction chart of the target obtained in Example 1 is shown in FIG. 1.

The theoretical relative density of the resulting target was 98%, and the bulk resistance measured by the four probe method was 1.0 mΩ·cm. The deflecting strength of the target was measured to show that the deflecting strength was 14 kg/mm². The deflecting strength was measured according to JIS R 1601.

The crystal state in the transparent conductive material (target) was observed by the X-ray diffraction method using a sample collected from the sintered body. As a result, the ilmenite structure compound of $ZnSnO_3$ was mainly observed in the target obtained. Presence of a small amount of a rutile structure compound shown by $SnO_2$ was also confirmed. Other compounds were not confirmed to be present. The peak derived from the ilmenite compound shifted toward the minus direction (narrow angle-side), and the shift distance of the maximum peak was about 0.5°.

The ilmenite compound of $ZnSnO_3$ is a compound which has a peak pattern of No. 52-1381 of the Joint Committee on Powder Diffraction Standards (JCPDS) database observed by X-ray diffraction or an analogous (shifted) pattern.

Furthermore, the sintered body was enveloped in a resin, and the surface was ground using alumina particles with a particle diameter of 0.05 μm and observed by an electron probe micro analyzer (EPMA) ("JXA-8621MX" manufactured by JEOL Ltd.) to measure the maximum diameter of the crystal particles observed in a 30 μm×30 μm square frame on the surface of the sintered body at a magnification of 5,000 times. The average value of the maximum particle diameters measured in the same manner in three frames was calculated to confirm that the crystal grain diameter of the sintered body was 3.0 μm.

The sintered body obtained in (1) above was cut and processed to prepare a sputtering target with a diameter of about 10 cm and a thickness of about 5 mm. A transparent conductive film was produced by sputtering the target.

(3) Preparation of Transparent Conductive Oxide (Transparent Conductive Film)

The sputtering target obtained in (1) above was mounted on a DC magnetron sputtering apparatus to prepare a transparent conductive film on a glass plate at room temperature.

The sputtering was carried out under the conditions of a sputtering pressure of $1\times10^{-1}$ Pa, an ultimate pressure of $5\times10^{-4}$ Pa, a substrate temperature of 200° C., electrical power of 120 W, and a film forming time of 15 minutes.

As a result, a transparent conductive glass consisting of a glass substrate and a transparent conductive oxide with a thickness of about 100 nm formed on the glass substrate was obtained.

After rotating the substrate holder such that the uniform film thickness distribution can be obtained, the specific resistance of 6 points on a radius of the substrate holder was measured. The maximum value thereof is divided by the minimum value thereof for evaluation of the in-plane distribution of specific resistance. As a result, the in-plane distribution was as significantly low as 1.1.

In Table 1, the results of PAN resistance evaluation are indicated as "Good" when the etching rate was 20 nm/min or less at 50° C., and as "Bad" when the etching rate was more than 20 nm/min at 50° C.

(4) Evaluation of Sputtering Conditions (i) Occurrence of Abnormal Electrical Discharge The sputtering target obtained in (1) above was mounted on a DC magnetron sputtering apparatus and sputtered under the same conditions as in (3) above, except that a mixed gas of argon gas and 3% hydrogen gas was used as the introduced gas. Occurrence of abnormal electrical discharge was monitored during the sputtering to confirm that no abnormal electrical discharge occurred during continuous sputtering for 240 hours. In Table 1, the occurrence of abnormal electrical discharge is indicated by "Yes" and nonoccurrence is indicated by "No".

(ii) Number of Nodules Produced

Sputtering was carried out continuously for eight hours under the same conditions as in (i) above. The surface of the target after sputtering was observed with a stereomicroscope at a magnification of 30 times. The number of nodules with a size of 20 μm or more produced in 900 mm² visual fields, each encircled by three arbitrary points on the target, was counted and the average was calculated.

(5) Evaluation of Properties of Transparent Conductive Film

To evaluate the electric conductivity of the transparent conductive film on the transparent conductive glass obtained in (3) above, the specific resistance was measured by the four probe method to show that the specific resistance was 750 μΩ·cm. It was confirmed that the transparent conductive film was amorphous by the X-ray diffraction analysis.

To evaluate smoothness of the film surface, the P-V value (according to JIS B0601) was measured to indicate that the P-V value was 5 nm, indicating good smoothness.

To evaluate transparency of the transparent conductive film, transmission of a light with a wavelength of 500 nm was measured with a spectrophotometer to confirm that the light transmission was 91%, indicating excellent transparency of the film.

The measuring conditions of the X-ray diffraction measurement (XRD) of the transparent conductive film were as follows.
Device: "Ultima-III" manufactured by Rigaku Corp.
X rays: Cu—Kα ray (wavelength; 1.5406 Å, monochromized by a graphite monochromator)
2θ-θ reflection method, continuous scan (1.0°/min)
Sampling interval: 0.02°
Slit DS, SS: ⅔°, RS: 0.6 mm

Examples 2 and Comparative Examples 1 to 5

Figure 2:
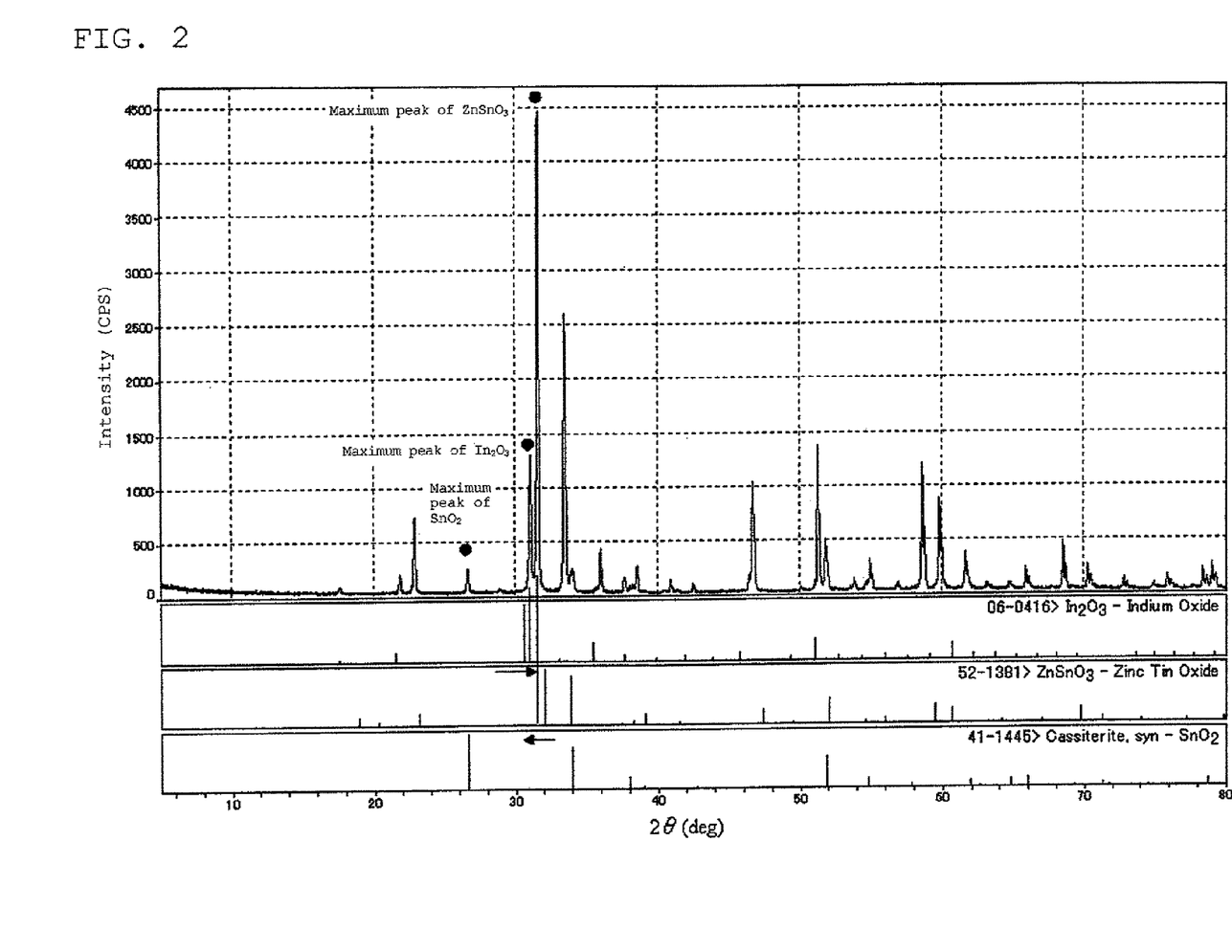
FIG. 2 is an X-ray diffraction chart of a target obtained in Example 2.

A target and a transparent conductive film were prepared and evaluated in the same manner as in Example 1, except that the amount ratio of the raw materials was adjusted such that the atomic ratios shown in Table 1 can be obtained, and that, in Comparative Examples 3 to 5, RF magnetron sputtering was used. The results are shown in Table 1. FIG. 2 is an X-ray diffraction chart of the target obtained in Example 2.

TABLE 1

|  | Target (sintered body) | Example | | Comparative Example | | | | |
|---|---|---|---|---|---|---|---|---|
|  |  | 1 | 2 | 1 | 2 | 3 | 4 | 5 |
| Atomic ratio | In/(In + Sn + Zn) | 0.36 | 0.41 | 0.36 | 0.36 | 0.36 | 0.2 | 0.0 |
|  | Sn/(In + Sn + Zn) | 0.33 | 0.31 | 0.04 | — | 0.66 | 0.4 | 0.5 |
|  | Zn/(In + Sn + Zn) | 0.31 | 0.28 | 0.60 | 0.64 | — | 0.4 | 0.5 |
|  | Sn/(Sn + Zn) | 0.52 | 0.53 | 0.06 | — | — | 0.5 | 0.5 |
| Sintering conditions | Sintering temperature | 1400 | 1400 | 1400 | 1400 | 1400 | 1400 | 1400 |
|  | Sintering time | 48 | 48 | 48 | 48 | 48 | 48 | 48 |
| X-ray diffraction | Crystal form | Yes | Yes |  |  |  |  |  |
|  | $ZnSnO_3$ (ilmenite) |  |  |  |  |  |  |  |
|  | $Zn_2SnO_4$ (spinel) |  |  |  |  |  |  | Yes |
|  | $In_2O_3$ (bixbyite) |  | Yes |  |  | Yes | Yes |  |
|  | $SnO_2$ (rutile) | Yes | Yes |  |  | Yes | Yes | Yes |
|  | ZnO (wurtzite) |  |  | Yes | Yes |  |  |  |
|  | $In_2O_3(ZnO)_m$ (hexagonal layered compound) |  |  | Yes | Yes |  | Yes |  |
|  | Maximum peak ratio [I($ZnSnO_3$)/I($SnO_2$)] | 20 | 18 | — | — | — | — | — |

TABLE 1-continued

| | | Example | | Comparative Example | | | | |
|---|---|---|---|---|---|---|---|---|
| | Target (sintered body) | 1 | 2 | 1 | 2 | 3 | 4 | 5 |
| Target properties | Relative Density (%) | 98 | 95 | 89 | 87 | 63 | 82 | 70 |
| | Bulk resistance | 1 mΩ·cm | 1.6 mΩ·cm | 7 mΩ·cm | 10 mΩ·cm | 150 Ω·cm | 17 kΩ·cm | 3 kΩ·cm |
| | Deflecting strength (kg/mm$^2$) | 14 | 13 | 11 | 11 | 9 | 10 | 9 |
| | Transparent conductive film | | | | | | | |
| Sputtering conditions | Abnormal electrical discharge | No | No | No | No | Yes | No | No |
| | Nodule(number/8 hours/90 mm$^2$) | 0 | 0 | 0 | 0 | 42 | 0 | 0 |
| Film properties | Specific resistance (μΩ·cm) | 750 | 600 | 1050 | 1100 | 1300 | 3500 | 10000 |
| | In-plane distribution(Max/Min) | 1.1 | 1.1 | 20 | 26 | 24 | 2.1 | 2.3 |
| | Crystallinity (X-ray diffraction) | Amorphous | Amorphous | Amorphous | Amorphous | Micro-crystalline | Amorphous | Amorphous |
| | PAN resistance | Good | Good | Bad | Bad | Good | Good | Good |

From the results shown in Table 1, it can be understood that the target of Example 1 which contained the ilmenite structure compound had a lower resistance and a higher sintered density as compared with the targets of Comparative Examples 1 to 3 which contained the same amount of indium. It can also be understood that no nodules were generated during sputtering and that the in-plane distribution of specific resistance of the transparent conductive film was small.

As a result of the comparison with the targets of Comparative Examples 4 and 5 which had the same amount ratio of tin and zinc, it can be understood that only the targets of Examples contained an ilmenite structure compound.

Example 3

The target of the invention was prepared which had a larger size than and the same raw material composition as that of Example 1. A transparent conductive film was formed by a large-sized sputtering apparatus provided with a load-lock system. Using this transparent conductive film, a transparent common electrode for a liquid crystal panel was prepared. The liquid crystal panel was operated without problems. From the results, it was confirmed that this transparent common electrode was as good as that prepared using ITO.

INDUSTRIAL APPLICABILITY

The invention provides a material containing an ilmenite structure compound which can be used in gas sensors, temperature sensors, and solar cell electrodes, and the method for producing the same. The invention also provides a target which is prepared using the above material; has a high theoretical relative density, a high resistance, a high strength and a low indium content; and enables stable sputtering while suppressing abnormal electrical discharge generated during formation of a transparent conductive film by the sputtering method, as well as a transparent conductive film having a small in-plane distribution of specific resistance prepared using such a target.

The transparent conductive film of the invention excels in conductivity, in-plane uniformity, thermal resistance or the like, and can be used in various applications such as displays represented by liquid crystal displays, touch panels, and dielectric protective layers for phase-change optical recording media.

The transparent conductive film of the invention is particularly useful as a transparent common electrode provided on the color filter side of a TFT-driven liquid crystal panel.

Further, since stable sputtering can be carried out, the target of the invention can be used for forming a transparent oxide semiconductor typified by a thin film transistor (TFT) by adjusting the film-forming conditions and the like.

The invention claimed is:

1. An oxide material comprising indium (In), tin (Sn), and metal element M, and comprising an ilmenite structure compound;
   wherein the atomic ratio of In/(In+Sn+M) is in a range of less than 0.55, the atomic ratio of Sn/(In+Sn+M) is in a range of 0.25 or greater, and the atomic ratio of M/(In+Sn+M) is in a range of 0.2 to 0.5.

2. The oxide material according to claim 1, wherein the metal element M is zinc (Zn).

3. The oxide material according to claim 1, wherein, in an X-ray diffraction (XRD), the maximum peak intensity of the ilmenite structure compound is at least 6 times as large as the maximum peak intensity of a rutile structure compound.

4. The oxide material according to claim 1, wherein, in an X-ray diffraction (XRD), the maximum peak position of the ilmenite structure compound shifts toward the minus direction (narrow-angle side) from the maximum peak position of ilmenite structure compound powder comprising tin and the metal element M.

5. The oxide material according to claim 1, which is a sintered body having, a bulk resistance of 0.2 to 10 mΩ·cm.

6. The oxide material according to claim 1, which is a sintered body having a theoretical relative density of 90% or more.

7. The oxide material according to claim 1, wherein the crystal grain diameter of the ilmenite structure compound is 20 μm or less.

8. A sputtering target, which comprises the oxide material according to claim 1.

9. A method for producing an oxide material comprising an ilmenite structure compound according to claim 1, which comprises heating raw materials at a temperature of 700° C. or higher;
   the raw materials being a tin compound, and an indium compound, and a compound of metal element M;
   an atomic ratio of indium (In/(In+Sn+M)) being 0.25 to 0.55 and an atomic ratio of tin (Sn/(In+Sn+M)) being 0.25 to 0.5 in the total amount of the raw materials.

10. A transparent conductive film, which is formed by sputtering the sputtering target according to claim 8.

11. A transparent common electrode provided on the color filter side of a TFT-driven liquid crystal panel, which comprises the transparent conductive film according to claim 10.

12. A transparent electrode, which is prepared by dry etching the transparent conductive film according to claim 10.

13. The method for producing an oxide material of claim 9 wherein the heating of the raw materials occurs in a environment containing oxygen gas at a temperature-elevating rate of 100° C./min.

* * * * *